(12) United States Patent
Sirajuddin et al.

(10) Patent No.: US 8,158,522 B2
(45) Date of Patent: Apr. 17, 2012

(54) METHOD OF FORMING A DEEP TRENCH IN A SUBSTRATE

(75) Inventors: Khalid M. Sirajuddin, San Jose, CA (US); Digvijay Raorane, Chandler, AZ (US); Jon C. Farr, Vallejo, CA (US); Sharma V. Pamarthy, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/879,874

(22) Filed: Sep. 10, 2010

(65) Prior Publication Data

US 2011/0201205 A1    Aug. 18, 2011

Related U.S. Application Data

(60) Provisional application No. 61/245,999, filed on Sep. 25, 2009.

(51) Int. Cl.
*H01L 21/311* (2006.01)

(52) U.S. Cl. .................. 438/696; 257/E21.218

(58) Field of Classification Search .......... 438/424, 438/427, 431, 437, 689, 694–696, 700, 706, 438/710, 712, 713, 720, 789, 790, 793, 794; 257/617, 622, 626, 629, 632, 642, 643, E21.218, 257/E21.219, E21.22, E21.221, E21.245, 257/E21.246

See application file for complete search history.

(56) References Cited

U.S. PATENT DOCUMENTS

| | | | | |
|---|---|---|---|---|
| 4,534,824 A * | 8/1985 | Chen | | 438/421 |
| 5,068,202 A * | 11/1991 | Crotti et al. | | 438/433 |
| 6,110,826 A * | 8/2000 | Lou et al. | | 438/674 |
| 6,147,005 A * | 11/2000 | Tu et al. | | 438/706 |
| 6,180,466 B1 * | 1/2001 | Ibok | | 438/296 |
| 7,285,499 B1 | 10/2007 | Bell et al. | | |
| 2004/0097077 A1* | 5/2004 | Nallan et al. | | 438/689 |
| 2006/0292877 A1 | 12/2006 | Lake | | |
| 2008/0023441 A1* | 1/2008 | Tsai | | 216/58 |

FOREIGN PATENT DOCUMENTS

KR    100168358    2/1999

OTHER PUBLICATIONS

International Search Report and Written Opinion for International Patent Application No. PCT/US2010/049346, Mailed Apr. 21, 2011, 10 pages.

\* cited by examiner

*Primary Examiner* — William D Coleman
*Assistant Examiner* — Su Kim
(74) *Attorney, Agent, or Firm* — Blakely Sokoloff Taylor & Zafman LLP

(57) ABSTRACT

Methods of forming deep trenches in substrates are described. A method includes providing a substrate with a patterned film disposed thereon, the patterned film including a trench having a first width and a pair of sidewalls, the trench exposing the top surface of the substrate. The method also includes forming a material layer over the patterned film and conformal with the trench. The method also includes etching the material layer to form sidewall spacers along the pair of sidewalls of the trench, the sidewall spacers reducing the first width of the trench to a second width. The method also includes etching the substrate to form a deep trench in the substrate, the deep trench undercutting at least a portion of the sidewall spacers.

16 Claims, 8 Drawing Sheets

METHOD OF FORMING A DEEP TRENCH IN A SUBSTRATE

CROSS-REFERENCE TO RELATED APPLICATIONS

This application claims the benefit of U.S. Provisional Application No. 61/245,999, filed Sep. 25, 2009, the entire contents of which are hereby incorporated by reference herein.

BACKGROUND

1) Field

Embodiments of the present invention pertain to the field of semiconductor processing and, in particular, to methods of forming deep trenches in substrates.

2) Description of Related Art

Conventional deep reactive ion etching or deep silicon etch processes often exhibit some level of undercut in the etch profile. For example, in some processes, chemical species such as fluorine radicals etch a via or a trench sidewall laterally (in addition to the desired vertical etch pathway) and in some case may cause significant undercut.

SUMMARY

Embodiments of the present invention include methods of forming deep trenches in substrates.

In an embodiment, a method includes providing a substrate with a patterned film disposed thereon, the patterned film including a trench having a first width and a pair of sidewalls, the trench exposing the top surface of the substrate. The method also includes forming a material layer over the patterned film and conformal with the trench. The method also includes etching the material layer to form sidewall spacers along the pair of sidewalls of the trench, the sidewall spacers reducing the first width of the trench to a second width. The method also includes etching the substrate to form a deep trench in the substrate, the deep trench undercutting at least a portion of the sidewall spacers.

In another embodiment, a method includes providing a substrate with a patterned film disposed thereon, the patterned film including a trench having a first width and a pair of sidewalls, the trench exposing the top surface of the substrate. The method also includes forming a first material layer over the patterned film and conformal with the trench. The method also includes etching the first material layer to form sidewall spacers along the pair of sidewalls of the trench, the sidewall spacers reducing the first width of the trench to a second width. The method also includes repeatedly etching, and forming a second material layer on resulting sidewalls of, the substrate to form a deep trench in the substrate, the deep trench undercutting at least a portion of the sidewall spacers and having a scalloped profile.

DETAILED DESCRIPTION

Figure 1A:
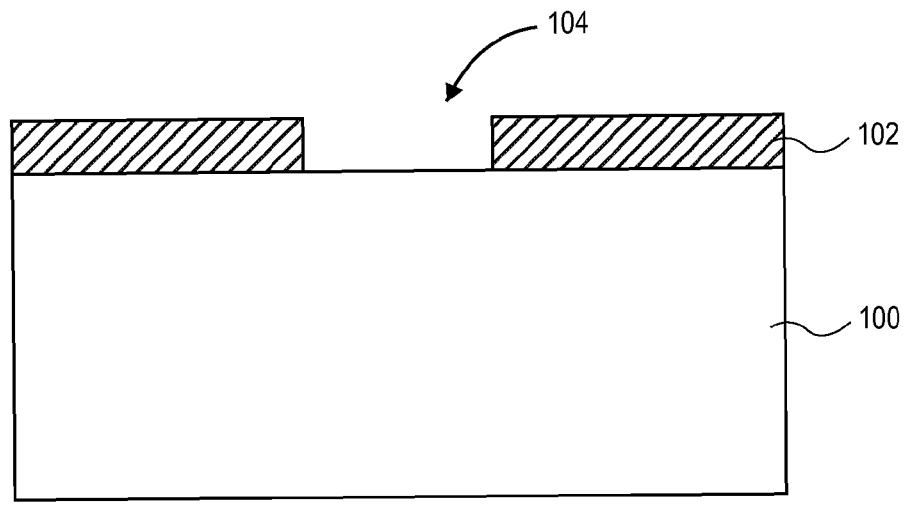
FIG. 1A illustrates a cross-sectional view representing an operation in a conventional method of forming a deep trench in a substrate.

Methods of forming deep trenches in substrates are described. In the following description, numerous specific details are set forth, such as deposition and etching conditions and material regimes, in order to provide a thorough understanding of embodiments of the present invention. It will be apparent to one skilled in the art that embodiments of the present invention may be practiced without these specific details. In other instances, well-known aspects, such as photolithography development techniques, are not described in detail in order to not unnecessarily obscure embodiments of the present invention. Furthermore, it is to be understood that the various embodiments shown in the Figures are illustrative representations and are not necessarily drawn to scale.

Disclosed herein are methods of forming deep trenches in substrates. In an embodiment, a method includes providing a substrate with a patterned film disposed thereon, the patterned film including a trench having a first width and a pair of sidewalls, the trench exposing the top surface of the substrate. A material layer is then formed over the patterned film and conformal with the trench. The material layer is then etched to form sidewall spacers along the pair of sidewalls of the trench, the sidewall spacers reducing the first width of the trench to a second width. The substrate is then etched to form a deep trench in the substrate, the deep trench undercutting at least a portion of the sidewall spacers. In another embodiment, a method includes providing a substrate with a patterned film disposed thereon, the patterned film including a trench having a first width and a pair of sidewalls, the trench exposing the top surface of the substrate. A first material layer is then formed over the patterned film and conformal with the trench. The first material layer is then etched to form sidewall spacers along the pair of sidewalls of the trench, the sidewall spacers reducing the first width of the trench to a second width. The substrate is then repeatedly etched, and a second material layer formed thereon, to form a deep trench in the substrate, the deep trench undercutting at least a portion of the sidewall spacers and having a scalloped profile.

Some embodiments of the present invention include an innovative approach to modulate silicon undercut in deep reaction ion etch and deep silicon etch processes. In accordance with an embodiment of the present invention, dimensions of a trench in a patterned film are reduced to accommodate an anticipated amount of undercut in a deep trench etch process. In one embodiment, a repeated etch/substrate sidewall deposition cycle process is included in a process wherein the dimensions of a trench in a patterned film are reduced to accommodate such an anticipated amount of undercut. In particular embodiments, a deep trench is a trench having a depth approximately in the range of 1 micron to several hundred microns. Benefits from some embodiments of the present invention may include one or more of, but are not limited to, significant undercut reduction in deep trench etching according to desired specifications, protection of a photo-resist layer by polymer deposited thereon for a more robust etch process, the applicability of the processes described herein to inductively coupled and capacitively coupled reactors or remote plasma chambers, and non-interference with typical etching processes.

A deep trench etch may be applied to a substrate using a conventionally patterned photo-resist and applying an etch process to the substrate. As an example, FIGS. 1A-1B illustrate cross-sectional views representing operations in a conventional method of forming a deep trench in a substrate.

Referring to FIG. 1A, a substrate 100 has a patterned film 102 disposed thereon. Patterned film 102 has a trench 104 formed therein. Referring to FIG. 1B, an etch process is performed on substrate 100 to provide a deep trench 106 in substrate 100. One feature of the above approach, which may not be desirable, is that the sidewalls 108 of deep trench 106 undercut portions of patterned film 102 by an amount 110, as depicted in FIG. 1B. The undercut may result from isotropic characteristics of the applied etch process.

Figure 1B:
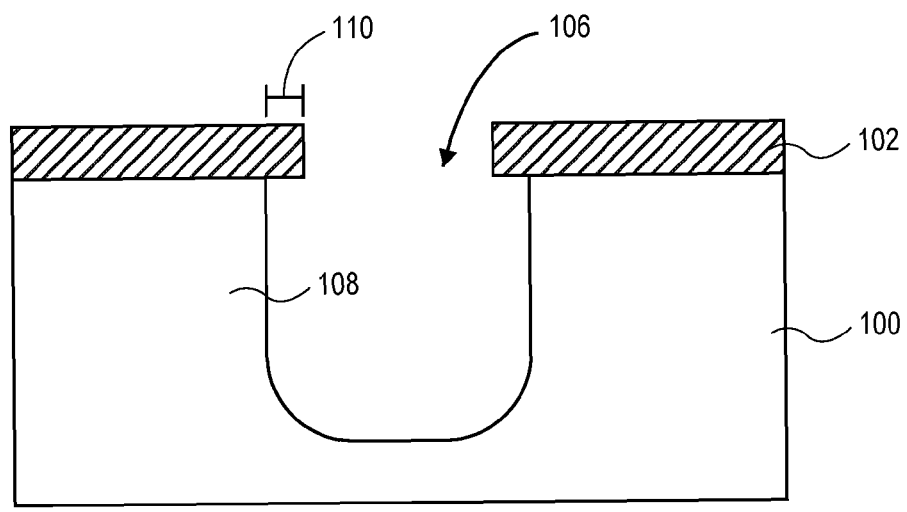
FIG. 1B illustrates a cross-sectional view representing an operation in a conventional method of forming a deep trench in a substrate.

Attempts have been made to mitigate an undercut like the undercut described in association with FIG. 1B. For example, FIGS. 2A-2B illustrate cross-sectional views representing operations in a conventional method of forming a deep trench in a substrate.

Figure 2A:
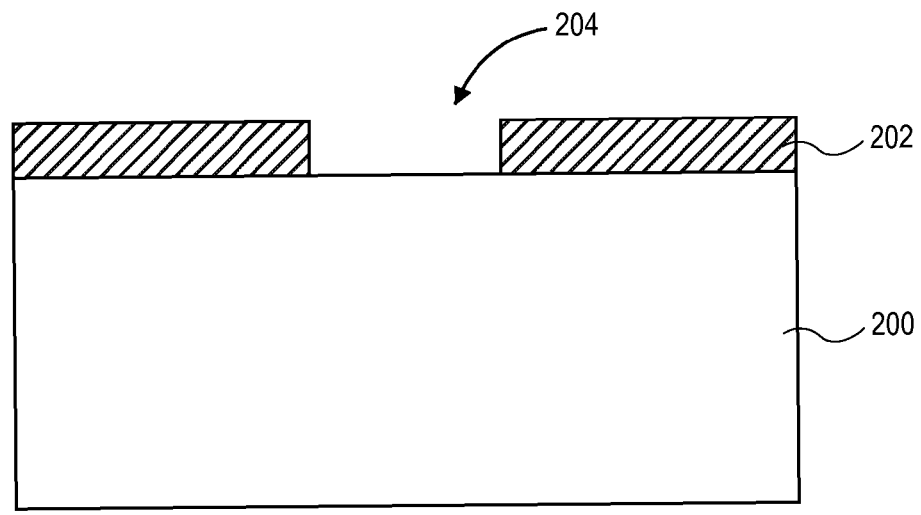
FIG. 2A illustrates a cross-sectional view representing an operation in a conventional method of forming a deep trench in a substrate.
Figure 2B:
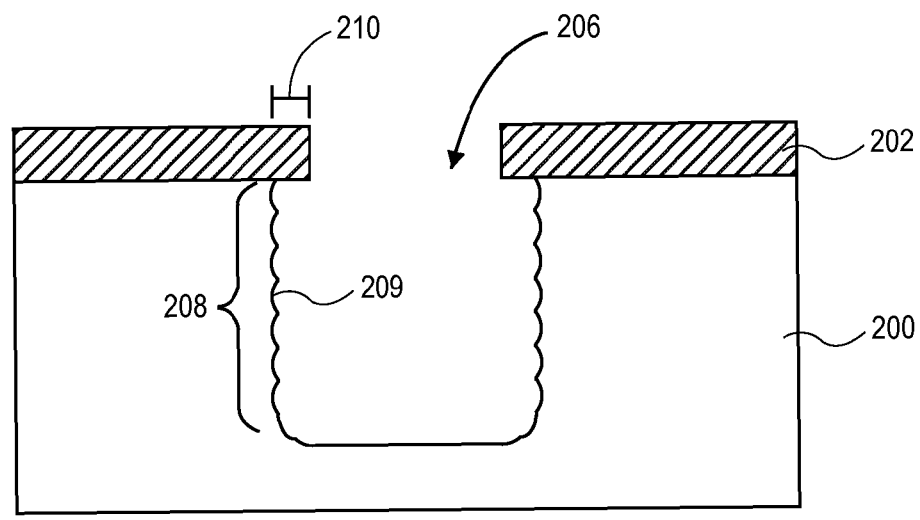
FIG. 2B illustrates a cross-sectional view representing an operation in a conventional method of forming a deep trench in a substrate.

Referring to FIG. 2A, a substrate 200 has a patterned film 202 disposed thereon. Patterned film 202 has a trench 204 formed therein. Referring to FIG. 2B, an etch process is performed on substrate 200 to provide a deep trench 206 in substrate 200. However, in this approach, a repeated etch/substrate sidewall deposition cycle process is applied, wherein a material layer is iteratively formed on the sidewalls of the deep trench throughout its formation. This approach may lead to the formation of scalloped features 209 on the sidewalls 208 of deep trench 206, which may or may not be desirable. More importantly, sidewalls 208 of deep trench 206 will often still undercut portions of patterned film 202 by an amount 210, as depicted in FIG. 2B, which may not be desirable. The undercut may result from isotropic characteristics of the applied etch process that are not totally mitigated by the repeated etch/substrate sidewall deposition cycle process.

Figure 3:
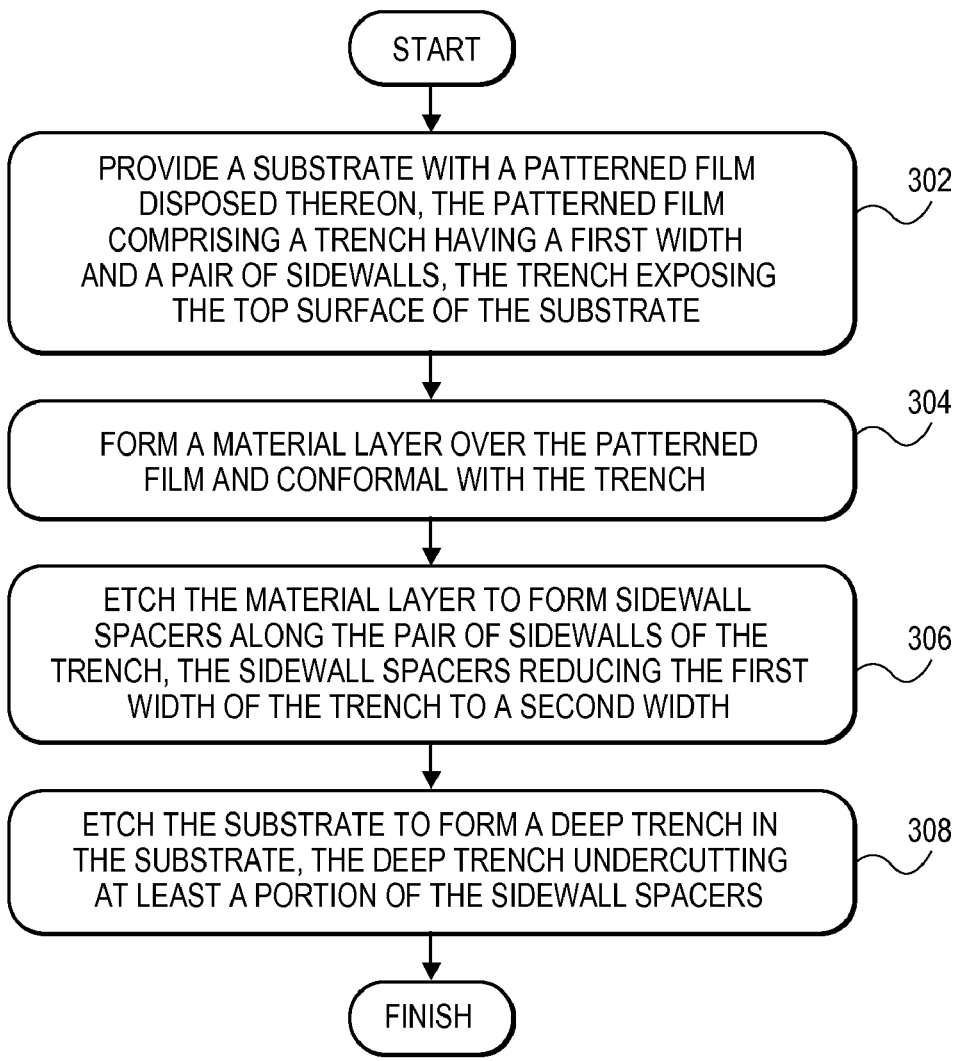
FIG. 3 is a Flowchart representing operations in a method of forming a deep trench in a substrate, in accordance with an embodiment of the present invention.

In an aspect of the present invention, the dimensions of a trench in a patterned film are reduced to accommodate an anticipated amount of undercut. For example, FIG. 3 is a Flowchart 300 representing operations in a method of forming a deep trench in a substrate, in accordance with an embodiment of the present invention. FIGS. 4A-4F illustrate cross-sectional views representing operations in a method of forming a deep trench in a substrate, in accordance with an embodiment of the present invention.

Figure 4A:
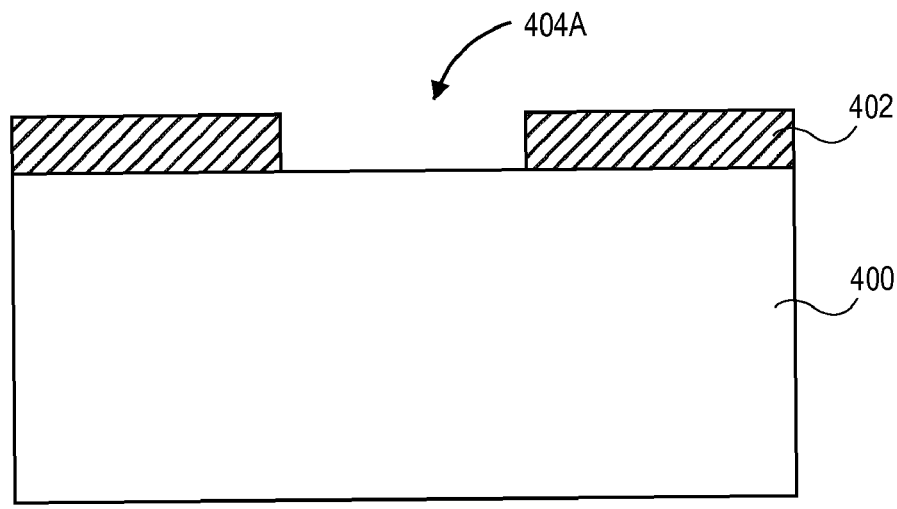
FIG. 4A illustrates a cross-sectional view representing an operation in a method of forming a deep trench in a substrate, in accordance with an embodiment of the present invention.

Referring to operation 302 of Flowchart 300 and corresponding FIG. 4A, a method of forming a deep trench in a substrate includes providing a substrate 400 with a patterned film 402 disposed thereon. In accordance with an embodiment of the present invention, patterned film 402 includes a trench 404A having a first width and a pair of sidewalls. Trench 404A exposes the top surface of substrate 400, as depicted in FIG. 4A.

Substrate 402 may be composed of a material suitable to withstand a fabrication process and upon which semiconductor processing layers may suitably reside. In accordance with an embodiment of the present invention, substrate 402 is composed of a group IV-based material such as, but not limited to, crystalline silicon, germanium or silicon/germanium. In a specific embodiment, providing substrate 400 includes providing a monocrystalline or polycrystalline silicon substrate. In a particular embodiment, the monocrystalline or polycrystalline silicon substrate is doped with impurity atoms. In another embodiment, substrate 402 is composed of a material.

Patterning film 402 may be composed of a material suitable for deposition and patterning on a substrate. In accordance with an embodiment of the present invention, patterning film 402 is composed of a layer of photo-resist and is suitable to withstand a deep substrate etch. The photo-resist layer may be composed of a material suitable for use in a lithographic process. That is, in an embodiment, the photo-resist layer will ultimately be exposed to a light source and subsequently developed. In one embodiment, the portions of the photo-resist layer to be exposed to the light source will be removed upon developing the photo-resist layer, e.g., the photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultraviolet (EUV) resist and a phenolic resin matrix with a diazonaphthoquinone sensitizer. In another embodiment, the portions of the photo-resist layer to be exposed to the light source will be retained upon developing the photo-resist layer, e.g., the photo-resist layer is composed of a negative photo-resist material. In a specific embodiment, the photo-resist layer is composed of a negative photo-resist material such as, but not limited to, poly-cis-isoprene and poly-vinyl-cinnamate. In an embodiment, patterning film 402 is composed of an Mine or G-line photo-resist material layer. In an embodiment, a hard mask layer is disposed between substrate 400 and patterning film 402. In one embodiment, the hard mask is composed of a material such as, but not limited to, silicon dioxide, silicon nitride, silicon oxynitride, or a combination thereof.

Figure 4B:
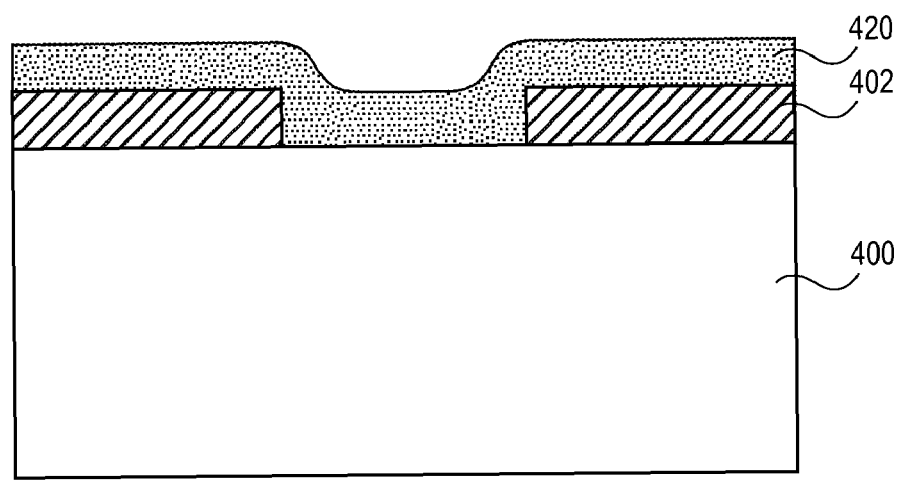
FIG. 4B illustrates a cross-sectional view representing an operation in a method of forming a deep trench in a substrate, in accordance with an embodiment of the present invention.

Referring to operation 304 of Flowchart 300 and corresponding FIG. 4B, a method of forming a deep trench in a substrate includes forming a material layer 420 over patterned film 402 and conformal with trench 404A.

Material layer 420 may be a material suitable for deposition on a patterned film, such as a layer of patterned photo-resist, and suitable to withstand a deep substrate etch. In accordance with an embodiment of the present invention, forming material layer 420 includes forming a polymer layer from a precursor including $C_4F_8$. In one embodiment, forming the polymer layer includes using a gaseous composition including an amount of $C_4F_8$ source gas approximately in the range of 100-500 sccm and an amount of helium and/or argon carrier gas approximately in the range of 0-500 sccm, the gaseous composition having a pressure approximately in the range of 10-200 mTorr, the gaseous composition biased approximately in the range of 0-150 Watts, and the gaseous composition having a source power applied thereto approximately in the range of 1000-5000 Watts. In an embodiment, material layer 420 is formed to a thickness of approximately half of the desired reduction width for trench 404A, as described below. In an embodiment, material layer 420 is deposited in a chamber such as, but not limited to, an inductively coupled plasma chamber or a capacitively coupled plasma chamber.

Figure 4C:
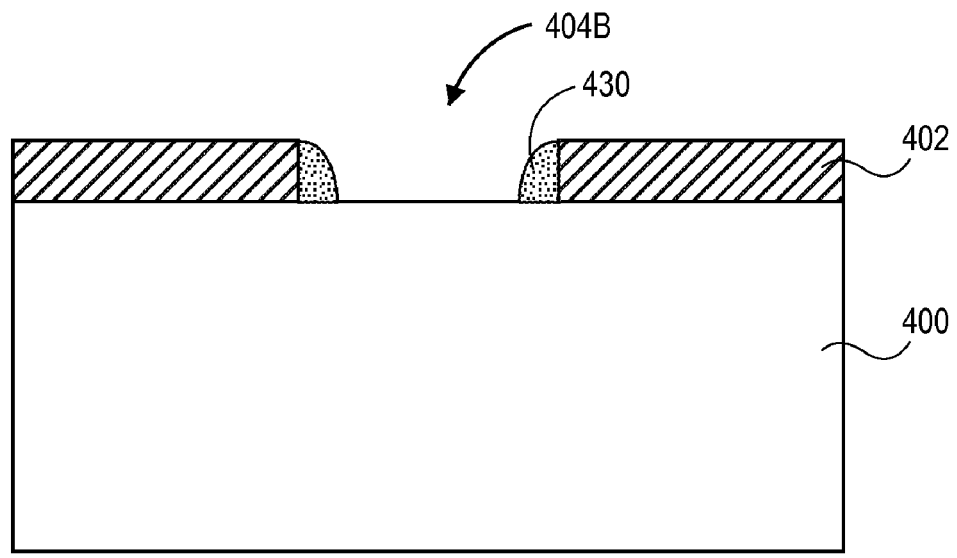
FIG. 4C illustrates a cross-sectional view representing an operation in a method of forming a deep trench in a substrate, in accordance with an embodiment of the present invention.

Referring to operation 306 of Flowchart 300 and corresponding FIG. 4C, a method of forming a deep trench in a substrate includes etching material layer 420 to form sidewall spacers 430 along the pair of sidewalls of trench 404A, the sidewall spacers 430 reducing the first width of the trench to a second width and forming trench 404B. In accordance with an embodiment of the present invention, the width of each sidewall spacer 430 and the interface with substrate 400 is approximately the thickness of material layer 420 at the time of its deposition. That is, in an embodiment, second width of trench 404B is narrower than first width of trench 404A by approximately twice the thickness of material layer 420 at the time of its deposition.

Material layer 420 may be etched to form sidewall spacers 430 by an etch process suitable for forming vertical spacers and selective to patterned film 402 and substrate 400. In accordance with an embodiment of the present invention, material layer 420 is etched to form sidewall spacers 430 by an etch selective to silicon.

Figure 4D:
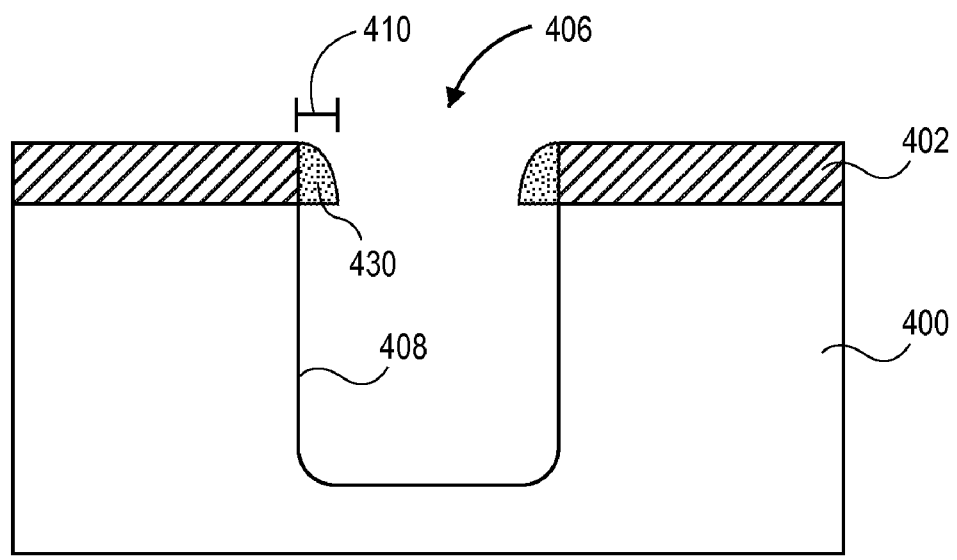
FIG. 4D illustrates a cross-sectional view representing an operation in a method of forming a deep trench in a substrate, in accordance with an embodiment of the present invention.

Referring to operation 308 of Flowchart 300 and corresponding FIG. 4D, a method of forming a deep trench in a substrate includes etching substrate 400 to form a deep trench 406 in substrate 400. In accordance with an embodiment of the present invention, the sidewalls 408 of deep trench 406 undercut at least a portion of the sidewall spacers 430 by an amount 410, as depicted in FIG. 4D.

The dimensions of trench 404A in patterned film 402 may be reduced, providing trench 404B, to accommodate an anticipated amount of undercut. For example, in accordance with an embodiment of the present invention, etching substrate 400 to form deep trench 406 includes undercutting approximately all of the sidewall spacers 430, but not undercutting patterned film 402, as depicted in FIG. 4D. In another embodiment, etching substrate 400 to form deep trench 406 includes undercutting a portion of, but not all of, the sidewall spacers 430. In another embodiment, etching substrate 400 to form deep trench 406 includes undercutting the sidewall spacers 430 and at least a portion of patterned film 402. In an embodiment, etching substrate 400 to form deep trench 406 includes etching selectively to the sidewall spacers 430 and using an etch chemistry including etchants such as, but not limited to, fluorine radicals, bromine radicals and chlorine radicals.

Figure 4E:
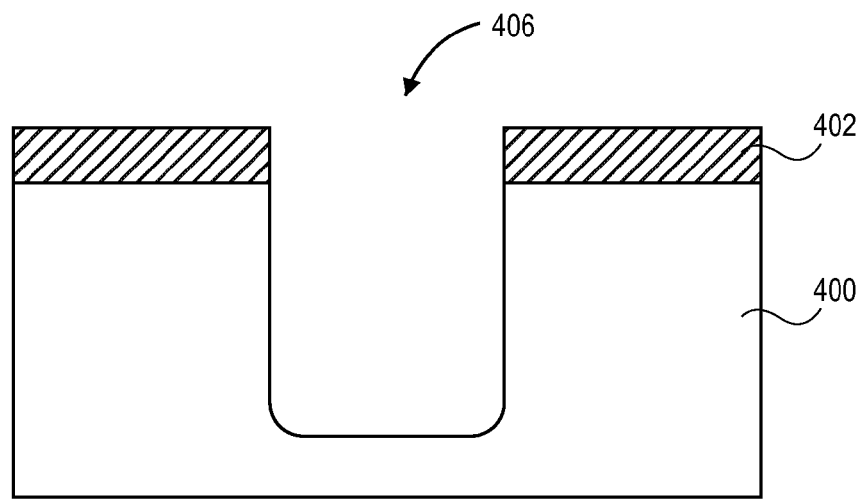
FIG. 4E illustrates a cross-sectional view representing an operation in a method of forming a deep trench in a substrate, in accordance with an embodiment of the present invention.
Figure 4F:
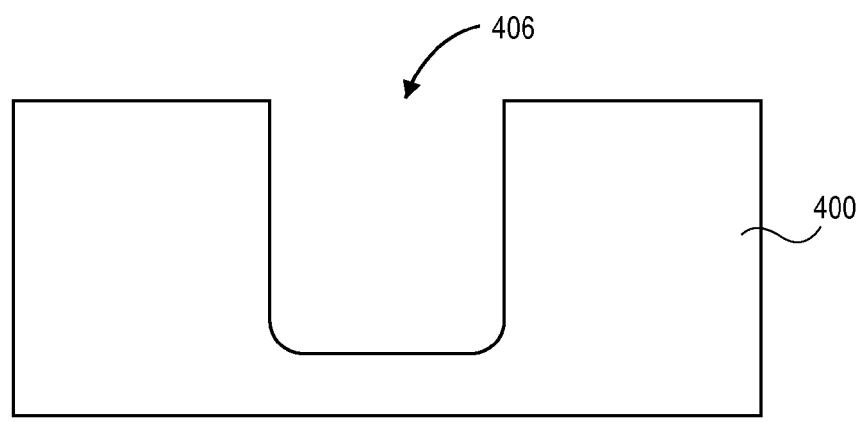
FIG. 4F illustrates a cross-sectional view representing an operation in a method of forming a deep trench in a substrate, in accordance with an embodiment of the present invention.

Referring to FIG. 4E, a method of forming a deep trench in a substrate may also include removing the sidewall spacers 430 to leave substrate 400, patterned film 402 and deep trench 406. In an embodiment, the sidewall spacers 430 are removed by a selective etch process such as a wet etch or dry etch process selective to patterned film 402 and substrate 400. Referring to FIG. 4F, a method of forming a deep trench in a substrate may also include subsequently removing patterned film 402 to leave substrate 400 and deep trench 406. In an embodiment, patterned film 402 is removed by a selective etch process such as a wet etch or dry etch process selective to substrate 400. However, in an alternative embodiment, the sidewall spacers 430 and patterned film 402 are removed at the same time, e.g., in the same etch process operation.

In another aspect of the present invention, a repeated etch/substrate sidewall deposition cycle process may be included in a process wherein the dimensions of a trench in a patterned film are reduced to accommodate an anticipated amount of undercut.

Figure 5:
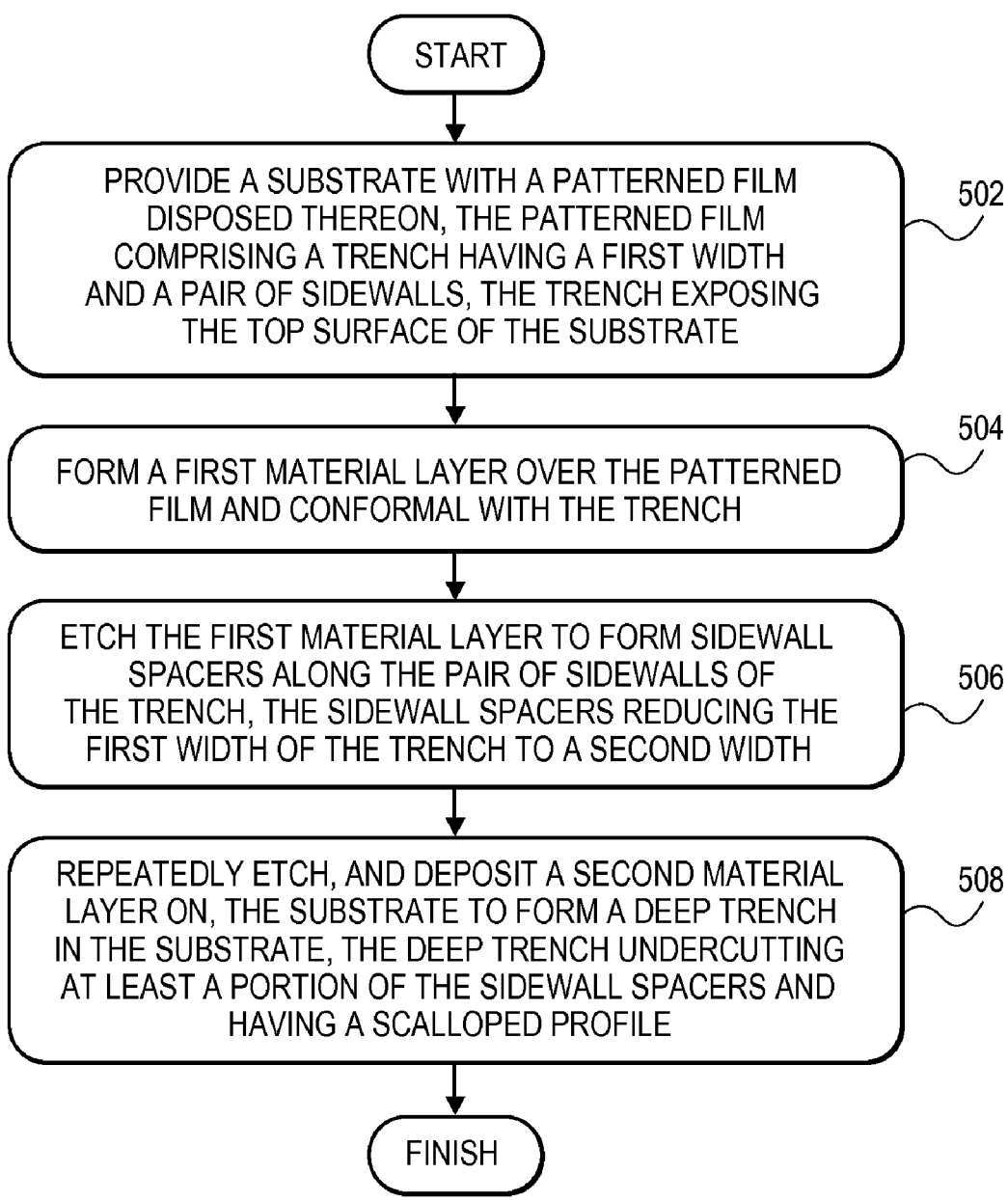
FIG. 5 is a Flowchart representing operations in a method of forming a deep trench in a substrate, in accordance with an embodiment of the present invention.

FIG. 5 is a Flowchart 500 representing operations in a method of forming a deep trench in a substrate, in accordance with an embodiment of the present invention. FIGS. 4A-4C and 6A-6C illustrate cross-sectional views representing operations in a method of forming a deep trench in a substrate, in accordance with an embodiment of the present invention.

Referring to operation 502 of Flowchart 500 and corresponding FIG. 4A, a method of forming a deep trench in a substrate includes providing a substrate 400 with a patterned film 402 disposed thereon. In accordance with an embodiment of the present invention, patterned film 402 includes a trench 404A having a first width and a pair of sidewalls. Trench 404A exposes the top surface of substrate 400, as depicted in FIG. 4A.

Substrate 402 may be composed of a material suitable to withstand a fabrication process and upon which semiconductor processing layers may suitably reside. In accordance with an embodiment of the present invention, substrate 402 is composed of a group IV-based material such as, but not limited to, crystalline silicon, germanium or silicon/germanium. In a specific embodiment, providing substrate 400 includes providing a monocrystalline or polycrystalline silicon substrate. In a particular embodiment, the monocrystalline or polycrystalline silicon substrate is doped with impurity atoms. In another embodiment, substrate 402 is composed of a III-V material.

Patterning film 402 may be composed of a material suitable for deposition and patterning on a substrate. In accordance with an embodiment of the present invention, patterning film 402 is composed of a layer of photo-resist and is suitable to withstand a deep substrate etch. The photo-resist layer may be composed of a material suitable for use in a lithographic process. That is, in an embodiment, the photo-resist layer will ultimately be exposed to a light source and subsequently developed. In one embodiment, the portions of the photo-resist layer to be exposed to the light source will be removed upon developing the photo-resist layer, e.g., the photo-resist layer is composed of a positive photo-resist material. In a specific embodiment, the photo-resist layer is composed of a positive photo-resist material such as, but not limited to, a 248 nm resist, a 193 nm resist, a 157 nm resist, an extreme ultra-violet (EUV) resist and a phenolic resin matrix with a diazonaphthoquinone sensitizer. In another embodiment, the portions of the photo-resist layer to be exposed to the light source will be retained upon developing the photo-resist layer, e.g., the photo-resist layer is composed of a negative photo-resist material. In a specific embodiment, the photo-resist layer is composed of a negative photo-resist material such as, but not limited to, poly-cis-isoprene and poly-vinyl-cinnamate. In an embodiment, patterning film 402 is composed of an Mine or G-line photo-resist material layer.

Referring to operation 504 of Flowchart 500 and corresponding FIG. 4B, a method of forming a deep trench in a substrate includes forming a first material layer 420 over patterned film 402 and conformal with trench 404A.

First material layer 420 may be a material suitable for deposition on a patterned film, such as a layer of patterned photo-resist, and suitable to withstand a deep substrate etch.

In accordance with an embodiment of the present invention, forming first material layer 420 includes forming a polymer layer from a precursor including $C_4F_8$. In one embodiment, forming the polymer layer includes using a gaseous composition including an amount of $C_4F_8$ source gas approximately in the range of 100-500 sccm and an amount of helium and/or argon carrier gas approximately in the range of 0-500 sccm, the gaseous composition having a pressure approximately in the range of 10-200 mTorr, the gaseous composition biased approximately in the range of 0-150 Watts, and the gaseous composition having a source power applied thereto approximately in the range of 1000-5000 Watts. In an embodiment, first material layer 420 is formed to a thickness of approximately half of the desired reduction width for trench 404A, as described below. In an embodiment, first material layer 420 is deposited in a chamber such as, but not limited to, an inductively coupled plasma chamber or a capacitively coupled plasma chamber.

Referring to operation 506 of Flowchart 500 and corresponding FIG. 4C, a method of forming a deep trench in a substrate includes etching first material layer 420 to form sidewall spacers 430 along the pair of sidewalls of trench 404A, the sidewall spacers 430 reducing the first width of the trench to a second width and forming trench 404B. In accordance with an embodiment of the present invention, the width of each sidewall spacer 430 and the interface with substrate 400 is approximately the thickness of first material layer 420 at the time of its deposition. That is, in an embodiment, second width of trench 404B is narrower than first width of trench 404A by approximately twice the thickness of first material layer 420 at the time of its deposition.

First material layer 420 may be etched to form sidewall spacers 430 by an etch process suitable for forming vertical spacers and selective to patterned film 402 and substrate 400. In accordance with an embodiment of the present invention, first material layer 420 is etched to form sidewall spacers 430 by an etch selective to silicon.

Figure 6A:
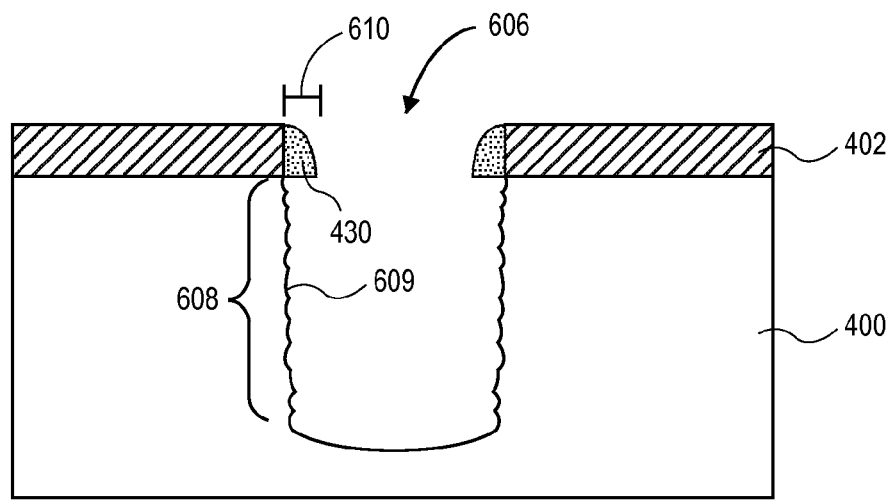
FIG. 6A illustrates a cross-sectional view representing an operation in a method of forming a deep trench in a substrate, in accordance with an embodiment of the present invention.

Referring to operation 508 of Flowchart 500 and corresponding FIG. 6A, a method of forming a deep trench in a substrate includes repeatedly etching, and forming a second material layer on resulting sidewalls of, substrate 400 to form a deep trench 606 in substrate 400. In accordance with an embodiment of the present invention, the sidewalls 608 of deep trench 606 have a scalloped profile 609 and undercut at least a portion of the sidewall spacers 430 by an amount 610, as depicted in FIG. 6A.

The dimensions of trench 404A in patterned film 402 may be reduced, providing trench 404B, to accommodate an anticipated amount of undercut. For example, in accordance with an embodiment of the present invention, repeatedly etching, and forming a second material layer on resulting sidewalls of, substrate 400 to form deep trench 606 includes undercutting approximately all of the sidewall spacers 430, but not undercutting patterned film 402, as depicted in FIG. 6A. In another embodiment, repeatedly etching, and forming a second material layer on resulting sidewalls of, substrate 400 to form deep trench 606 includes undercutting a portion of, but not all of, the sidewall spacers 430. In another embodiment, repeatedly etching, and forming a second material layer on resulting sidewalls of, substrate 400 to form deep trench 606 includes undercutting the sidewall spacers 430 and at least a portion of patterned film 402. In an embodiment, repeatedly etching, and forming a second material layer on resulting sidewalls of, substrate 400 to form deep trench 606 includes etching selectively to the sidewall spacers 430 and using an etch chemistry including etchants such as, but not limited to, fluorine radicals, bromine radicals and chlorine radicals.

Figure 6B:
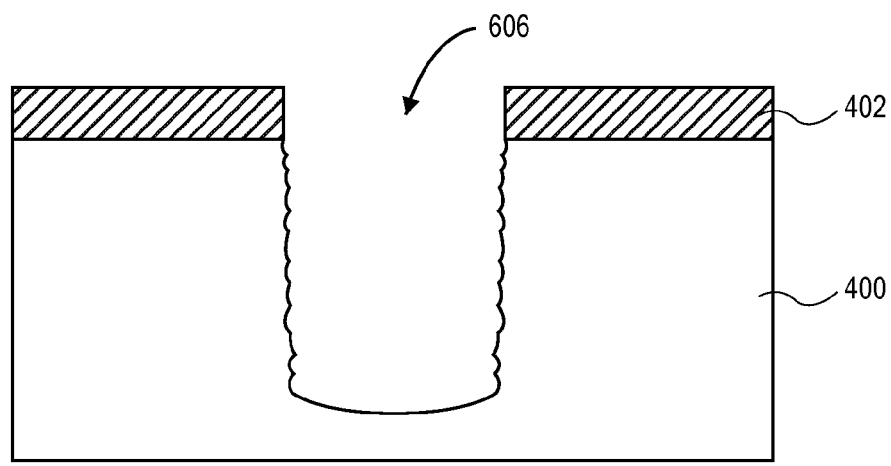
FIG. 6B illustrates a cross-sectional view representing an operation in a method of forming a deep trench in a substrate, in accordance with an embodiment of the present invention.
Figure 6C:
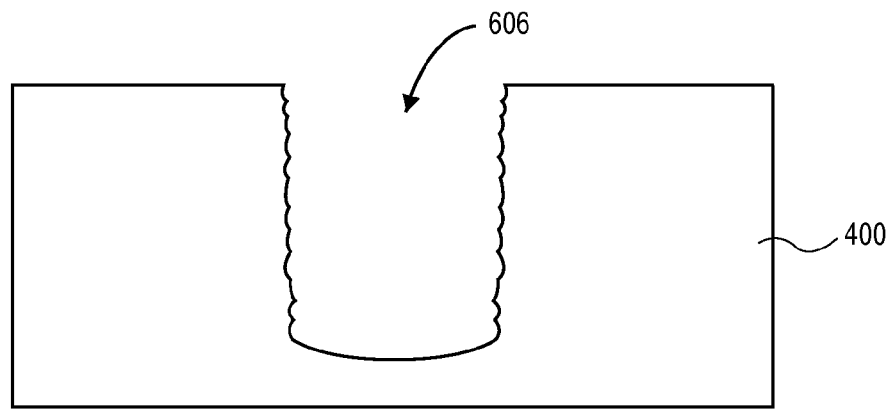
FIG. 6C illustrates a cross-sectional view representing an operation in a method of forming a deep trench in a substrate, in accordance with an embodiment of the present invention.

Referring to FIG. 6B, a method of forming a deep trench in a substrate may also include removing the sidewall spacers 430 to leave substrate 400, patterned film 402 and deep trench 606. In an embodiment, the sidewall spacers 430 are removed by a selective etch process such as a wet etch or dry etch process selective to patterned film 402 and substrate 400. Referring to FIG. 6C, a method of forming a deep trench in a substrate may also include subsequently removing patterned film 402 to leave substrate 400 and deep trench 606. In an embodiment, patterned film 402 is removed by a selective etch process such as a wet etch or dry etch process selective to substrate 400. However, in an alternative embodiment, the sidewall spacers 430 and patterned film 402 are removed at the same time, e.g., in the same etch process operation.

Thus, methods of forming deep trenches in substrates have been disclosed. In accordance with an embodiment of the present invention, a method includes providing a substrate with a patterned film disposed thereon, the patterned film including a trench having a first width and a pair of sidewalls, the trench exposing the top surface of the substrate. The method also includes forming a material layer over the patterned film and conformal with the trench. The method also includes etching the material layer to form sidewall spacers along the pair of sidewalls of the trench, the sidewall spacers reducing the first width of the trench to a second width. The method also includes etching the substrate to form a deep trench in the substrate, the deep trench undercutting at least a portion of the sidewall spacers. In one embodiment, the method further includes removing the sidewall spacers and, subsequently, removing the patterned film. In another embodiment, the method further includes removing the sidewall spacers and the patterned film at the same time. In one embodiment, etching the substrate to form the deep trench includes undercutting approximately all of the sidewall spacers, but not undercutting the patterned film.

What is claimed is:

1. A method of forming a deep trench in a substrate, the method comprising:
   providing a substrate with a patterned film disposed thereon, the patterned film comprising a trench having a first width and a pair of sidewalls, the trench exposing the top surface of the substrate;
   forming a material layer over the patterned film and conformal with the trench, wherein forming the material layer comprises forming a polymer layer using a gaseous composition comprising an amount of $C_4F_8$ source gas approximately in the range of 100-500 sccm and an amount of helium and/or argon carrier gas approximately in the range of 0-500 sccm, the gaseous composition having a pressure approximately in the range of 10-200 mTorr, the gaseous composition biased approximately in the range of 0-150 Watts, and the gaseous composition having a source power applied thereto approximately in the range of 1000-5000 Watts;
   etching the material layer to form sidewall spacers along the pair of sidewalls of the trench, the sidewall spacers reducing the first width of the trench to a second width; and
   etching the substrate to form a deep trench in the substrate, the deep trench undercutting at least a portion of the sidewall spacers.

2. The method of claim 1, further comprising:
   removing the sidewall spacers; and, subsequently,
   removing the patterned film.

3. The method of claim 1, further comprising:
removing the sidewall spacers and the patterned film at the same time.

4. The method of claim 1, wherein etching the substrate to form the deep trench comprises undercutting approximately all of the sidewall spacers, but not undercutting the patterned film.

5. The method of claim 1, wherein etching the substrate to form the deep trench comprises undercutting a portion of, but not all of, the sidewall spacers.

6. The method of claim 1, wherein etching the substrate to form the deep trench comprises undercutting the sidewall spacers and at least a portion of the patterned film.

7. The method of claim 1, wherein etching the substrate to form the deep trench comprises etching selectively to the sidewall spacers and using an etch chemistry comprising etchants selected from the group consisting of fluorine radicals, bromine radicals and chlorine radicals.

8. The method of claim 1, wherein providing the substrate comprises providing a monocrystalline or polycrystalline silicon substrate.

9. A method of forming a deep trench in a substrate, the method comprising:
providing a substrate with a patterned film disposed thereon, the patterned film comprising a trench having a first width and a pair of sidewalls, the trench exposing the top surface of the substrate;
forming a first material layer over the patterned film and conformal with the trench, wherein forming the first material layer comprises forming a polymer layer using a gaseous composition comprising an amount of $C_4F_8$ source gas approximately in the range of 100-500 sccm and an amount of helium and/or argon carrier gas approximately in the range of 0-500 sccm, the gaseous composition having a pressure approximately in the range of 10-200 mTorr, the gaseous composition biased approximately in the range of 0-150 Watts, and the gaseous composition having a source power applied thereto approximately in the range of 1000-5000 Watts;
etching the first material layer to form sidewall spacers along the pair of sidewalls of the trench, the sidewall spacers reducing the first width of the trench to a second width; and
repeatedly etching, and forming a second material layer on resulting sidewalls of, the substrate to form a deep trench in the substrate, the deep trench undercutting at least a portion of the sidewall spacers and having a scalloped profile.

10. The method of claim 9, further comprising:
removing the sidewall spacers; and, subsequently,
removing the patterned film.

11. The method of claim 9, further comprising:
removing the sidewall spacers and the patterned film at the same time.

12. The method of claim 9, wherein repeatedly etching, and forming the second material layer on resulting sidewalls of, the substrate to form the deep trench comprises undercutting approximately all of the sidewall spacers, but not undercutting the patterned film.

13. The method of claim 9, wherein repeatedly etching, and forming the second material layer on resulting sidewalls of, the substrate to form the deep trench comprises undercutting a portion of, but not all of, the sidewall spacers.

14. The method of claim 9, wherein repeatedly etching, and forming the second material layer on resulting sidewalls of, the substrate to form the deep trench comprises undercutting the sidewall spacers and at least a portion of the patterned film.

15. The method of claim 9, wherein repeatedly etching, and forming the second material layer on resulting sidewalls of, the substrate to form the deep trench comprises etching selectively to the sidewall spacers and using an etch chemistry comprising etchants selected from the group consisting of fluorine radicals, bromine radicals and chlorine radicals.

16. The method of claim 9, wherein providing the substrate comprises providing a monocrystalline or polycrystalline silicon substrate.

* * * * *